Figure 1:
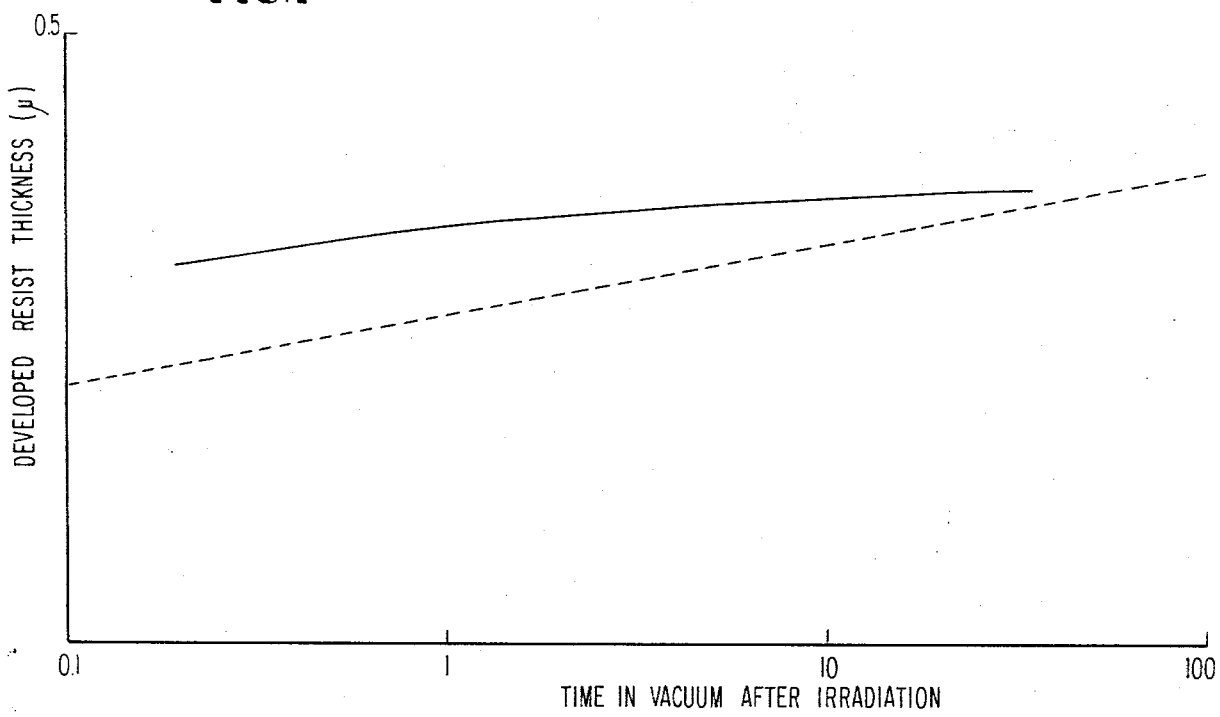

United States Patent [19]

Ohnishi et al.

[11] 4,279,986
[45] Jul. 21, 1981

[54] NEGATIVE RESIST AND RADICAL SCAVENGER COMPOSITION WITH CAPABILITY OF PREVENTING POST-IRRADIATION POLYMERIZATION

[75] Inventors: Yoshitake Ohnishi; Masaki Itoh; Kenji Mizuno; Hiroshi Gokan, all of Tokyo, Japan

[73] Assignee: Nippon Electric Co., Ltd., Tokyo, Japan

[21] Appl. No.: 59,845

[22] Filed: Jul. 23, 1979

Related U.S. Application Data

[63] Continuation of Ser. No. 911,580, Jun. 1, 1978, abandoned.

[30] Foreign Application Priority Data

Jun. 1, 1977 [JP] Japan .................................. 52/65082
Jul. 6, 1977 [JP] Japan .................................. 52/81318
Jul. 6, 1977 [JP] Japan .................................. 52/81319

[51] Int. Cl.³ .............................................. G03C 1/68
[52] U.S. Cl. ................................. 430/280; 204/159.14; 204/159.18; 204/159.23; 430/296; 430/309; 430/917

[58] Field of Search ............... 430/280, 296, 917, 309; 204/159.14, 159.18, 159.23

[56] References Cited

U.S. PATENT DOCUMENTS

| 3,864,133 | 2/1975 | Hisamatsu et al. ................. 430/917 |
| 3,989,610 | 11/1976 | Tsukada et al. ..................... 430/280 |
| 4,025,348 | 5/1977 | Tsukada et al. ..................... 430/280 |
| 4,097,283 | 6/1978 | Asano et al. ........................ 430/280 |
| 4,130,424 | 12/1978 | Feit et al. ............................ 430/280 |

OTHER PUBLICATIONS

Billmeyer, Textbook of Polymer Science, (1971), pp. 285–286.
Vollmert, Polymer Chemistry, (1973), pp. 61–63.

Primary Examiner—Jack P. Brammer
Attorney, Agent, or Firm—Sughrue, Rothwell, Mion, Zinn and Macpeak

[57] ABSTRACT

A lithographic resist for use in microfabrication comprising a negative-type resist containing a radical scavenger capable of preventing post-irradiation reaction.

5 Claims, 2 Drawing Figures

NEGATIVE RESIST AND RADICAL SCAVENGER COMPOSITION WITH CAPABILITY OF PREVENTING POST-IRRADIATION POLYMERIZATION

This is a continuation of application Ser. No. 911,580, filed June 1, 1978, now abandoned.

This invention relates to a radiation-sensitive composition capable of preventing the chemical reaction which might otherwise be caused even after the irradiation by light or other radiant rays is terminated (hereunder referred to as a post-irradiation reaction).

It is well known that the optical lithography using a photosensitive material as a resist cannot give a desired microfabrication accuracy on the order of the light wavelength. Lithography using radiant rays of an extremely short wavelength such as an electron beam or X-ray, has been proposed so as to attain more precise fabrication. A radiation-sensitive material of this type is referred to as an electron-beam resist, X-ray resist or the like, and is generally composed of a high polymer compound.

As well known, such resists are classified into two types, i.e., a positive type in which the molecular weight of the polymer is reduced due to the scission of polymer molecular chains caused by irradiation by light and other radiant rays, and a negative type in which crosslinking is caused by the irradiation with the increase of the molecular weight of the polymer. Since the that low molecular weight components of a high polymer compound have a high solubility in a solvent, when light or other radiant rays are irradiated onto a high polymer compound coated on a substrate according to a desired pattern, and the thus treated substrate is dipped in a suitable solvent, the polymer portions of relatively low molecular weight are dissolved and removed therefrom, while the portions of relatively high molecular weight remain unremoved. As a result, in the negative-type resist, a resist pattern is formed by development defined by irradiated portions which remain unremoved on the substrate. On the other hand, in the positive-type resist, a reversed pattern is obtained. The sensitivity of such a resist is difficult to define, because it depends on the developing process. However, a fundamental factor determining the sensitivity lies in the extent the scission or crosslinking caused by radiant-ray or light-irradiation at a given dose. In the initial stages of study of electron-beam lithography, a photoresist was employed for an electron-beam resist. However, the recent technological progress has permitted the development of a resist specifically adapted for use in electron-beam or X-ray exposure.

A negative-type resist for electron-beam irradiation is disclosed in Japanese Patent Application Disclosure Nos. 74427/1975 and 73705/1975 (corresponding to the U.S. Pat. Application Ser. Nos. 408927, 412930, and 412933, respectively).

Such negative electron-beam-resists have disadvantages, however, the present invention provides a composition free from these disadvantages.

More particularly, the study of precision microfabrication conducted by the present inventors using negative-type resists containing repetitive units, each of which has a functional group to cause a crosslinking reaction upon radiant-ray irradiation, showed that the resist allowed the reaction to continue even after the irradiation was terminated. This phenomenon means that, in the case of a precise pattern manufacture on a substrate, the first-delineated portion of the resist undergoes a dimensional change as compared with the last-delineated portion thereof.

The present inventors not only discovered the fact that radicals and/or the like produced by such an irradiation remain after termination of the irradiation, thus causing post-irradiation reactions, but also found that such a post-irradiation reaction can be effectively prevented by the addition of a reaction-inhibitor such as a radical scavenger. This result was confirmed through tests of negative-type resists, such as a negative resist wherein a crosslinking reaction is carried out due to ring cleavage of epoxy groups, and cross-linking results from carbon-carbon double bonds.

It is an object of the present invention to provide a radiation-sensitive composition containing a high polymer compound and a reaction inhibitor for preventing the above-mentioned post-irradiation reaction.

According to the present invention, microfabrication can be accomplished without a significant deviation from an intended design value by prevention of the post-irradiation reaction. In the present invention, therefore, even if the pattern delineation requires duration of considerable duration of time, the first-irradiated portion does not dimensionally change as compared with the last-irradiated portion.

In the prior art process of microfabrication using a negative-type resist, after the completion of the exposure, a substrate is stored in vacuum for a given period of time for annealing and the above-mentioned reaction is allowed to proceed to improve uniformity in pattern dimensions. The present invention can save the time required for the annealing process, thus enhancing the practical operational efficiency of the exposure system.

Figure 2:
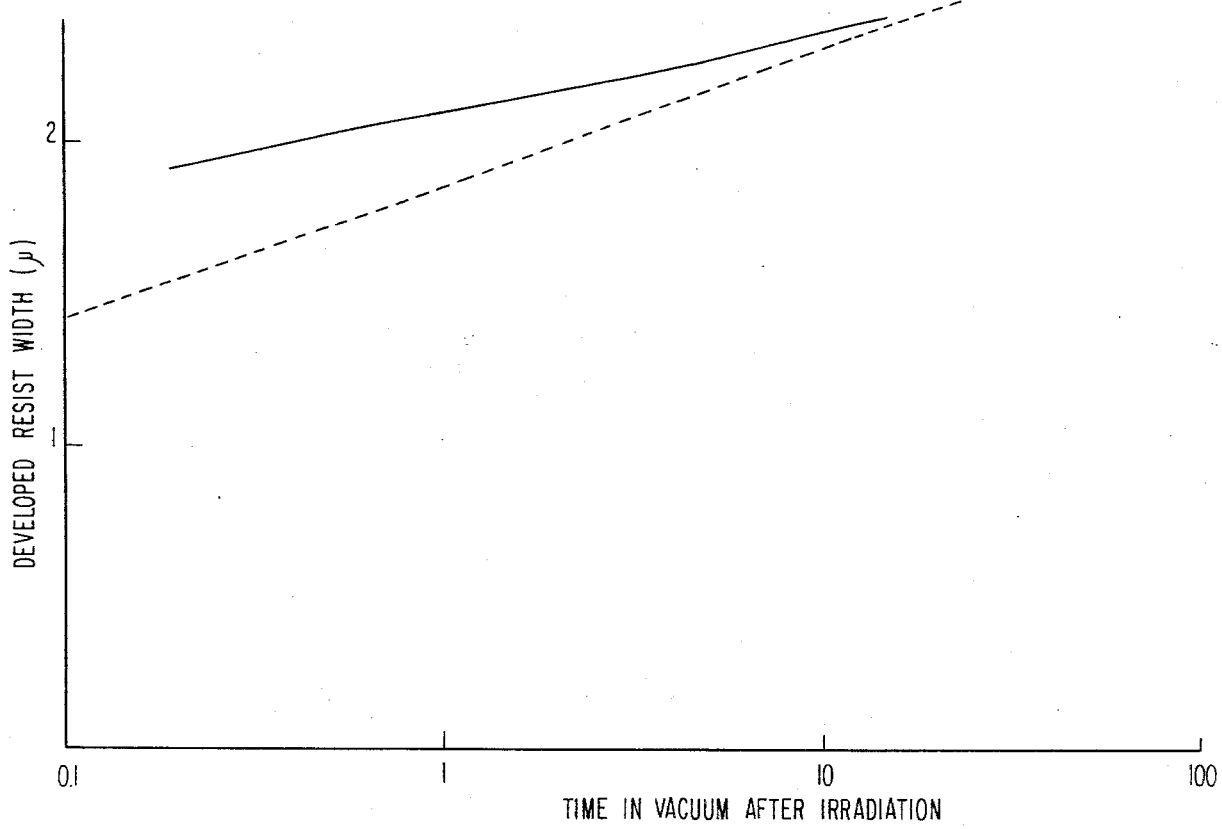

The present invention will now be described in more detail in conjunction with the accompanying drawings in which FIGS. 1 and 2 are graphs for explaining the advantages of the present invention.

More specifically, FIG. 1 is a graph showing a residual-film-thickness to representing the amount of high polymer compound subjected to a post-irradiation reaction by the use of an electron beam. The high polymer resist (to be referred to as P (GMA-co-EA) hereinafter) is derived by copolymerizing glycidyl methacrylate (GMA) with ethyl acrylate (EA) at a ratio of GMA : EA=68:32.

FIG. 2 is a graph showing the amount of P (GMA-co-EA) resist subjected to the post-irradiation reaction in terms of the line width relative to the design value of a two-micron-line width.

The solid line and the dashed line in FIGS. 1 and 2 represent P (GMA-co-EA) resist having DPPH (1, 1-diphenyl-2-picryl-hydrazyl) of five weight percent added thereto and not having said DPPH, respectively. Symbols A and B given to Examples to be described hereinafter represent those for the prior art and those for the present invention, respectively.

EXAMPLE A-1

P (GMA-co-EA) was used as a resist, without an additive added thereto and a pattern delineation was applied thereto using electron-beam irradiation. EA is a component for improving adhesion, GMA has an epoxy group for causing crosslinking. The copolymer, having a molecular weight of about 260,000, was dissolved in a chlorobenzene solvent at a concentration of twelve weight percent. The thus prepared solution was applied to a chrome mask blank (or chrominum-on-glass substrate) by means of a spinner (3000 rpm/min) followed by prebaking at 60° C. (degrees centigrade) for 30 minutes to obtain a uniform film of 0.6 micron in thickness. Then various kinds of pattern delineations were applied at an acceleration voltage of 20 KV (kilovolts) and a dose of $3.1 \times 10^{-7}$ coulomb/cm$^2$ in an electron-beam-exposure system with the line width and line spacing varied. After the exposure process, said substrate was held in the vacuum state in the exposure system for a given time. The pattern delineation was applied to a portion other than the former portion on the same substrate at a given time interval under the same conditions, repeatedly, and a chrome mask blank was then taken out of the exposure system. Next, the blank was dipped in a liquid developer containing 5 parts of methyl ethyl ketone and 2 parts of ethanol for 90 seconds for development followed by rinsing with isopropyl alcohol for 45 seconds, thereby obtaining a resist pattern.

The accurate-measurement results of these patterns are show with the relationship between the thickness of residual films and the (line) width of the films, and the time held in the vacuum state after the ray irradiation. The relationship of the film thickness and said time becomes 0.22 micron in 0.2 hour; 0.27 micron in one hour; 0.29 micron in three hours; 0.33 micron in ten hours; and 0.375 micron in 67 hours. These results show that a crosslinking reaction proceeds with even after the ray-irradiation is terminated. This is best shown by the dashed line in FIG. 1.

Also, the relationship between the line width of the films and time becomes 1.4 microns in 0.2 hour, 1.8 microns in one hour, 2.1 microns in three hours, 2.3 microns in ten hours, and 2.6 microns in 67 hours. It should be noted that the above-mentioned delineation was performed to make resist patterns of a design value of two-micron width at the spacing of one micron. This is represented by a broken line in FIG. 2. Thus, it is shown that the post-irradiation reaction has an adverse influence not only on the width of the resist pattern but also on the thickness thereof. This fact shows that mere exposure for a long period of time cannot give an accurate pattern fabrication.

EXAMPLE A-2

To analyse the mechanism which allows the post-irradiation reaction in Example A-1, air was introduced onto the surface of a resist immediately after the irradiation. Then, the interior of a container was evacuated and the resist was allowed to stand for several tens of hours and the result was free of the post-irradiation reaction. In addition, it was found that while the introduction of nitrogen gives no effect, such a reaction may be inhibited by the introduction of oxygen. It follows from these facts that the reaction in the vacuum state after the irradiation ceases is a radical reaction, oxygen being a typical radical scavenger.

EXAMPLE A-3

A fogging or a spontaneous insolubilization-preventive agent has been proposed for a resist containing an epoxy group in, U.S. Pat. No. 3,801,538. A strong electrolyte as proposed in the U.S. Patent was added and the experiment was then carried out according to method described in Example A-1. The experimental result showed that the addition of the strong electrolyte did not prevent the post-irradiation reaction. More specifically, addition of one to three weight percent of potassium iodide to a high polymer compound was found ineffective for the prevention of the post-irradiation reaction; this was true even in the case where ten weight percent of potassium iodide was added. The results signify that the fogging phenomenon resulting from deterioration of a material during storage and the post-irradiation reaction which proceeds in the vacuum state are different in mechanism, and that different preventive methods should be considered consequently.

EXAMPLE B-1

Five weight percent of DPPH was added to P (GMA-co-EA) resist. When the same test as in Example A-1, was used it was found that exposure was insufficient. For this reason, the dose upon exposure had to be increased to $5.4 \times 10^{-7}$ coulomb/cm$^2$. Otherwise same test procedure as that given in Example A-1 was followed, to prepare a resist pattern. The results of precise measurement of thus obtained resist patterns reveals that a reaction proceeds for a relatively short period of time after irradiation termination, and stops soon thereafter so that a uniform pattern may be achieved.

The results of the measurements of the thickness of residual films after the development of the resist are shown by a solid line in FIG. 1, while the results of the measurements of the line widths of the resist are represented by a solid line in FIG. 2.

EXAMPLE A-4

A half weight percent of DPPH relative to the amount of polymer was added to a high polymer compound P (GMA-co-EA) resist to prepare a composition which was tested according to the procedure referred to in Example A-1. In this case, while the prevention of fogging, i.e., thermal stability during storage and prebaking, was improved to some extent, this attempt was found not to be effective in preventing a post-irradiation reaction.

EXAMPLE B-2

Ten weight percent of DPPH relative to the amount of a polymer (as used in Example B-1) was added to a high polymer compound P (GMA-co-EA), and thus treated composition was then given the above-mentioned test.

In this case, the dose needed for the pattern making was increased to $9.0 \times 10^{-7}$ coulomb/cm$^2$; the prevention of post-irradiation reaction was found to be remarkable. Also, a resist pattern thus obtained well withstood a chrome etching solution (an aqueous solution, in which perchloric acid was added to ceric ammonium nitrate) so as to form a chrome mask.

EXAMPLE B-4

Five weight percent of galvinoxyl was added to a high polymer compound P (GMA-co-EA), and the same results as those obtained in Example B-1 were achieved thereafter.

EXAMPLE B-5

A composition which was prepared by adding ten weight percent of iodine to a high polymer compound P (GMA-co-EA), showed a preventive effect on the post-irradiation reaction, but the effect achieved was less than that obtained by Example B-2. However, the dose needed for the pattern manufacture was not increased to as much as $3.5 \times 10^{-7}$ coulomb/cm².

EXAMPLE A-5

Pattern delineation was applied by electron beam irradiation to a resist containing fourteen weight percent of cyclized polybutadiene without adding a reaction-inhibitor thereto. The thus prepared resist was applied to a chrome mask blank by means of a spinner (6000 rpm/min) followed by prebaking at 80° C. for 15 minutes, thereby obtaining a uniform film of 0.7 microns in thickness. Then, various pattern delineations were applied to films thus prepared in an electron-beam-exposure system at an acceleration voltage of 20 KV and at a dose of $1 \times 10^{-6}$ coulomb/cm² with the line width and line spacing varied. After predetermined time intervals the pattern delineation was applied to portions other than the first-delineated portions on the same substrate under the same conditions after which a chrome mask blank was taken out of the exposure system. Next, the thus obtained substrate was dipped in a liquid developer consisting mainly of xylene under stirring for development followed by dipping in n-butyl acetate for 30 seconds for rinsing, thereby obtaining a resist pattern.

Close observation of resist patterns thus obtained reveals that the patterns obtained 30 minutes (i.e., the substrate was retained in the vacuum state in the exposure system for 30 minutes), 1 hour, 2 hours, 3 hours, 5 hours, and 20 hours after the ray irradiation gave progressively increased widths despite the irradiation given under the same conditions. This proves that the pattern delineation due to the irradiation for over 30 minutes is not recommendable.

EXAMPLE A-6

The same test as the one given in Example A-1 was given to polydiallylorthophthalate (PDOP) as a resist. Fifteen weight percent of PDOP was dissolved in cyclohexane so as to prepare a solution which was applied to the resist by means of a spinner (2000 rpm/min), thereby obtaining a film of 0.52 microns in thickness. The film was then subjected to natural drying without prebaking. Next, pattern delineation was applied thereto in the same manner as that given in Example A-1 in an electron-beam-exposure system at an acceleration voltage of 20 KV and a dose of $2.2 \times 10^{-6}$ coulomb/cm². The film was then dipped in methyl ethyl ketone for 100 seconds for development, thereby obtaining a resist pattern. Similarly, this resist pattern showed an increase in line width corresponding to the duration of time after the ray irradiation.

EXAMPLE B-6

Five weight percent of DPPH relative to the amount of cyclized polybutadiene was added to a resist containing fourteen weight percent of cyclized polybutadiene as used in Example A-5. When the composition was tested in the same manner as that used in Example A-5, it was found that the dose of the irradiation was not sufficient. The dose had to be increased to $1.8 \times 10^{-6}$ coulomb/cm². Otherwise, the same test procedure as that used in Example A-5 was followed.

Close observation of the resist patterns thus obtained reveals that a pattern with a uniform line width is achieved in a range of up to 20 hours of time duration after the ray irradiation.

EXAMPLE B-7

Ten weight percent and two and a half weight percent of DPPH as used in Example B-1 were added separately, to a high polymer compound in a resist as given in Example A-5. The same procedures as given in Example A-5 were carried out. However, the dose had to be increased to $3.5 \times 10^{-6}$ coulomb/cm² for the composition containing ten weight percent of DPPH, while the dose had to be increased to $1.3 \times 10^{-6}$ coulomb/cm² for the composition containing 2.5 weight percent of DPPH, respectively. Even the composition containing ten weight percent of DPPH could ensure satisfactory adhesion and chemical resistance. Thus, a substrate having a uniform resist pattern was dipped in a chrome etching solution (an aqueous solution containing ceric ammonium nitrate and perchloric acid) for 45 seconds so as to form a chrome mask. In the case of the composition containing 2.5 weight percent of DPPH, the line width of a resist pattern was increased slightly corresponding to the duration of time after the ray irradiation.

EXAMPLE B-8

Five weight percent of galvinoxly was added to high polymer compound in a resist given in Example A-5 with the same result as that obtained in Example B-6.

EXAMPLE B-9

Five weight percent of DPPH and five weight percent of galvinoxyl were separately added to a high polymer compound in a resist consisting of a 15% solution PDOP used in Example A-6 to obtain two compositions to which were given the tests given in Example A-6. However, the dose had to be increased to $4 \times 10^{-6}$ coulomb/cm². The resist patterns thus obtained were found to be uniform in thickness and width, irrespective of the duration of time after the ray irradiation.

EXAMPLE B-10

Ten weight percent of iodine was added to a high polymer compound in a resist as used in Example A-5. While this composition showed an inhibiting effect on the post-irradiation relation, the effect thereof was still short of that obtained in Examples B-6 to B-8. However, the dose needed for the pattern manufacture was not increased to as much as $1.2 \times 10^{-6}$ coulomb/cm².

EXAMPLE A-7

By electron-beam irradiation, a pattern delineation was applied to a resist which contained fourteen weight percent of cyclized polybutadiene to its solution and in which five weight percent of 2, 6-di-(4° azidobenzal) cyclohexanone serving as an azido crosslinking agent so as to increase the sensitivity was added, but without adding a reaction inhibitor thereto. The treated resist was applied to a chrome mask blank by means of a spinner (6000 rpm/min) followed by prebaking at 80° C. for 15 minutes so that a uniform film of 0.7 microns in thickness could be obtained. Then, various pattern delineations were applied to films in an electron-beam-exposure system at an acceleration voltage of 20 KV and a dose of $8 \times 10^{-7}$ coulomb/cm² with the line width and line spacing varied. The pattern delineation was again applied to other portions on the same substrate at given time intervals under the same conditions. After these manipilations, the chrome mask blank was taken out of the exposure system and developed with a liquid developer consisting of mainly of xylene, for 60 seconds under agitation as being dipped therein followed by the rinsing in n-butyl acetate for 30 seconds. In this way, a resist pattern was obtained.

Close observation of the resist patterns thus obtained reveals that the patterns obtained at 30 minutes (i.e., a pattern was retained in an exposure system maintained in vacuum for 30 minutes), 1 hour, 2 hours, 3 hours, 5 hours, and 20 hours after the ray irradiation provided progressively increased widths despite the irradiation applied under the same conditions. It was found to be not recommendable take over 30 minutes for the pattern delineation.

EXAMPLE B-11

Five weight percent of DPPH was added to a high polymer compound in a resist used in Example A-7 composition. Tests were given to the thus prepared according to the same procedure as that given in Example A-7. However, the dose upon irradiation had to be increased to $1.4 \times 10^{-6}$ coulomb/cm$^2$.

Close observation of the resist patterns thus obtained reveals that patterns having a uniform line width in a range of up to 20 hours duration of time after the ray irradiation were obtained.

EXAMPLE B-12

Five weight percent of galvinoxyl was added to a high polymer compound in a resist as given in Example A-7, thereby achieving the same result as that obtained in Example B-11.

EXAMPLE B-13

A composition in which ten weight percent of iodine relative to a polymer was added to a resist as used in Example A-7 exhibited an inhibiting effect on the post-irradiation reaction. However, the effect thereof was found to be still inferior to that obtained in Example B-11. However, the dose required upon irradiation was not increased to as much as $1 \times 10^{-6}$ coulomb/cm$^2$.

The crosslinking reaction which continues after irradiation termination involves many unknown facts in its mechanism. However, it is believed that the movement or diffusion speed of ions through a solid body is extremely slow so that a chain reaction due to radicals is predominant.

The effect after the ray irradiation is reported in "Journal of Polymer Science", B4, P.493, 1961 by M. Prince and J. Horryak. The paper says that when radiant rays were irradiated onto acryl amide at a low temperature, radicals are produced. However, if the low temperature is continued keeping the radical inactive, no polymerization reaction is caused. When the irradiated monomer is subjected to a temperature rise, however, polymerization may take place without further irradiation. This polymerization is referred to as post-polymerization.

In the case of a negative-type resist according to the present invention, i.e., in the case of a resist of the type in which a crosslinking reaction is caused due to the irradiation of radiant rays, the degree of polymerization is increased resulting in increase of molecular weight. It is considered that reactive radicals produced due to the irradiation continue the polymerization reaction without disappearance of the radical, if the atmosphere is vacuum even after the ray irradiation ceases and that the activity of radicals is finally lost due to their mutual collision.

Based on these assumptions, the post-irradiation effect shown by the broken lines in FIGS. 1 and 2 is well understood. According to the present invention, a reaction-inhibitor such as a stable radical DPPH is admixed with a resist and active radicals collide with the inhibitor, thereby losing their activity. Consequently, the continuation of a polymerizing reaction can be stopped as demonstrated by the solid lines in FIGS. 1 and 2.

Accordingly, the invention should not be construed in a limited sense, but has application to all high polymer compounds which undergo a polymerizing reaction with a reactive radical.

In Examples B-1 to B-5, glycidylmethylacrylate-ethylacrylate copolymer and epoxidized 1, 4-polybutadiene are enumerated as high polymer compounds having epoxy groups. The present invention may be applied with the same result to other high polymer compounds having an epoxy group such as homopolymer of glycidyl methacrylate, epoxidized 1,2 polybutadiene and the like.

The present invention may be applied to resists containing polymers which cause crosslinking due to an unsaturated carbon-carbon bond like the cyclized polybutadiene and polydiallylorthophthalate of Examples B-6 to B-10. Other such polymers include, for instance, polybutadiene, styrene-butadiene copolymer, high polymer compounds containing acrylic acid groups or methacrylic acid groups in side chains and vinyl group containing silicone resins such as polyvinylsiloxane.

As radical scavengers for the reaction inhibitors used in Examples B-1 to B-13, the following stable radicals may be employed: tri-p-nitrophenylmethyl, di-p-fluoroaniline, N-(3N-oxyanilino-1, 3-dimethylbuthylidene) aniline oxide and the like, and substitution compounds and homologues thereof; alkyl iodide; quinones such as p-benzoquinone, anthraquinone, chloranil, and the like; polyhydroxy compounds such as hydroquinone, catechol, p-butylcatechol; amino compounds such as pyridine, methylaniline, p-phenylenediamine, N, N'-tetraethyl-p-phenylenediamine and the like; nitro compounds such as m-dinitrobenzene, 2, 4-dinitrotoluene, 2, 4-dinitrophenol, picric acid and the like; nitroso compounds such as nitrosobenzene, nitroso-$\beta$-naphtol and the like; organosulfur compounds such as dithiobenzoylsulfide, p, p'-ditolyltrisulfide, p, p'-ditolyltetrasulfide and the like; and metal chlorides such as ferrous chloride, cupric chloride, titanium trichloride, nickel dichloride and the like.

Although these reaction-inhibitors give different inhibiting effects on the post-irradiation reaction, the use of those for providing the most remarkable inhibiting effects is accompanied with a requirement for increase of the dose to from the resist pattern, i.e., a slight degradation of the sensitivity. The user may select the amount to be added and type of inhibitor depending on the accuracy of pattern required. Also, it is known that a combination of two or more types of inhibitors may provide a multiplicated effect. The present invention is by no means limited to reaction inhibitors as given in Examples B-1 to B-13 but to preventive agents and inhibitors for a radical reaction and the like, which are well known in the field of radiation chemistry.

As is apparent from the foregoing description of the invention, a reaction inhibitor is added to a negative-type resist containing a functional group adapted to cause a crosslinking reaction due to the irradiation of radiant rays, thereby inhibiting the post-irradiation reaction.

What is claimed is:

1. A radiation sensitive composition comprising a negative resist material having epoxy groups and from about 2.5 to about 10 weight percent of 1,1-diphenyl-2-picrylhydrazyl.

2. A composition as defined in claim 1, wherein said negative resist material contains glycidyl methacrylate as a monomer unit.

3. A composition as defined in claim 2, wherein said netative resist is a copolymer of glycidyl methacrylate and ethyl acrylate.

4. A method of reducing post-irradiation reaction of a negative resist material having epoxy groups comprising adding to said material prior to irradiation from about 2.5 to about 10 weight percent of 1,1-diphenyl-2-picrylhydrazyl.

5. A lithographic resist comprising a support having thereon a layer of negative resist material having epoxy groups and from about 2.5 to about 10 weight percent of 1,1-diphenyl-2-picrylhydrazyl.

* * * * *

UNITED STATES PATENT AND TRADEMARK OFFICE
CERTIFICATE OF CORRECTION

PATENT NO. : 4,279,986

DATED : July 21, 1981

INVENTOR(S) : Yoshitake Ohnishi; Masaki Itoh; Kenji Mizuno and Hiroshi Gokan

It is certified that error appears in the above-identified patent and that said Letters Patent are hereby corrected as shown below:

Column 1, line 31, delete "that".
Column 2, lines 24-25, delete "duration of" (both occurrences)
Column 2, line 42, delete "to".
Column 5, line 48, "$2.2 \times 10^{-6}$" not printed clearly.
Column 5, line 62 "$1.8 \times 10^{-6}$" not printed clearly.
Column 6, line 25, correct spelling of "galvinoxyl".
Column 6, line 35, "$10^{-6}$" not printed clearly.
Column 6, line 47, "$10^{-6}$" not printed clearly.
Column 6, line 53, "(4°" should be --(4'--.
Column 6, line 63, "$10^{-7}$" not printed clearly.

Column 8, line 16, correct spelling of "epoxy".
Column 8, line 53, "from" should be --form--.

Signed and Sealed this

Twenty-seventh Day of October 1981

[SEAL]

Attest:

GERALD J. MOSSINGHOFF

Attesting Officer     Commissioner of Patents and Trademarks